(12) United States Patent
Mullady

(10) Patent No.: US 6,626,688 B1
(45) Date of Patent: Sep. 30, 2003

(54) MECHANISM FOR SEATING AND UNSEATING A MODULE HAVING AN ELECTRICAL CONNECTOR

(75) Inventor: Robert K. Mullady, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/225,870

(22) Filed: Aug. 22, 2002

(51) Int. Cl.[7] .......................... H01R 13/62; H05K 7/16
(52) U.S. Cl. ........................................ 439/157; 361/727
(58) Field of Search ................................. 439/157, 310, 439/372, 297; 361/726, 727

(56) References Cited

U.S. PATENT DOCUMENTS

| | | | | |
|---|---|---|---|---|
| 3,575,482 A | * | 4/1971 | MacMaster et al. | 312/332.1 |
| 4,352,492 A | * | 10/1982 | Smith | 463/44 |
| 4,939,622 A | * | 7/1990 | Weiss et al. | 361/727 |
| 5,299,945 A | * | 4/1994 | Norden | 439/157 |
| 5,790,373 A | * | 8/1998 | Kim et al. | 361/685 |
| 6,183,275 B1 | * | 2/2001 | Okura et al. | 439/157 |
| 6,186,827 B1 | * | 2/2001 | Okabe | 439/544 |
| 6,406,312 B1 | * | 6/2002 | Heitkamp | 439/160 |

* cited by examiner

Primary Examiner—Chandrika Prasad
(74) Attorney, Agent, or Firm—Floyd A. Gonzalez

(57) ABSTRACT

A mechanism and method for seating and unseating a module in a rack having a floor with slidable engagement with the module. The mechanism includes a linear stop for stopping the movement of the module into the rack. A camming foot is provided for coacting with a hole in the floor of the rack for seating and unseating the module in the rack. An adjustment device provides for moving the linear stop from an inmost position to an outmost position, and simultaneously lowering the camming foot into the hole in the floor and moving the camming foot to urge the module into a fully seated position wherein the module is moved against the linear stop when the linear stop is in its outmost position.

10 Claims, 4 Drawing Sheets

US 6,626,688 B1

MECHANISM FOR SEATING AND UNSEATING A MODULE HAVING AN ELECTRICAL CONNECTOR

BACKGROUND OF THE INVENTION

The present invention is related to a mechanism for seating and unseating a module having an electrical connector, and is particularly related to seating and unseating of connectors requiring an insertion/extraction force that requires mechanical advantage to seat and unseat the connector where the seating mechanism does not add to the dimensions of the module.

Seating mechanisms for modules having an electrical connector are known and rely on a camming mechanism requiring an actuating handle. Other seating mechanisms are known having jackscrews screwed into or through mounting flanges to seat or unseat the electrical connector. Many of the mechanisms add to the dimensions, such as the width, of the module.

SUMMARY OF THE INVENTION

The present invention uses a rotating camming action combined with a linear traveling stop to seat a module such as a Field Replaceable Unit (FRU) such that a connector half on the FRU is inserted into connector half on a rack into which the FRU is placed. The linear stop provides the ability to withdraw the FRU, and the rotating cam draws the FRU into the connector. When the FRU is inserted, the rotating cam is totally contained within the FRU and the linear stop controls the point to which the FRU can be inserted, thus preventing any pins in the connector from making contact in an uncontrolled fashion. As the seating mechanism is actuated, the linear stop moves backward to allow the rotating cam to draw the FRU into the connector in a controlled fashion.

BRIEF DESCRIPTION OF THE DRAWINGS

These and other objects will be apparent to one skilled in the art from the following detailed description of the invention taken in conjunction with the accompanying drawings in which.

DESCRIPTION OF THE PREFERRED EMBODIMENT

Figure 1:
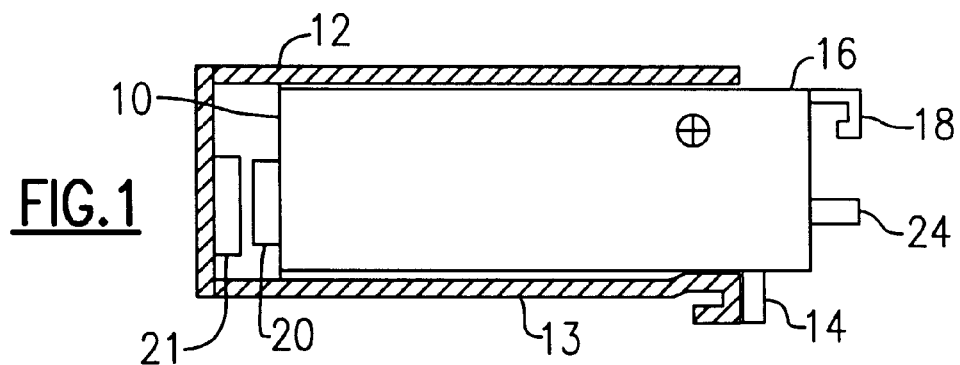
FIG. 1 is a diagrammatic illustration of an electronic module such as a Field Replaceable Unit (FRU) in a rack, and includes a seating mechanism for seating the FRU in the rack.

FIG. 1 is a diagrammatic illustration of an electronic module 10 such as a Field Replaceable Unit (FRU) in a rack 12, and includes a seating mechanism 14 for seating the FRU 10 in the rack 12. The FRU 10 includes a metal top 16 having a handle 18 extending from the top 16 to assist in slidably mounting the FRU 10 in the rack 12. At the back of the FRU 10 is a connector half 20 which mates with a connector half 21 in the back of the rack 12. The connector halves 20 and 21 may form a high pin count connector having a high insertion/extraction force requirement requiring mechanical advantage to seat and unseat the connector 20, 21. The mechanical advantage is supplied by the seating mechanism 14 which interacts with the floor 13 to provide the insertion/extraction force to seat and unseat the connector 20, 21, as will be explained.

Figure 2:
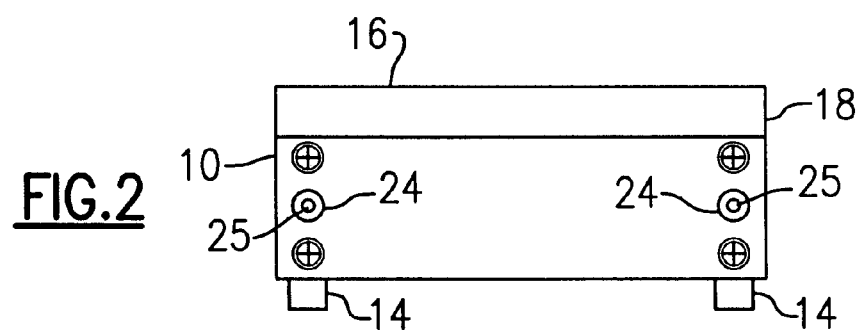
FIG. 2 is a front view of the FRU of FIG. 1.

FIG. 2 is a front view of the FRU 10 of FIG. 1, and shows that the FRU 10 has two identical seating mechanisms 14, one on each side of the FRU 10. The seating mechanisms 14 are actuated by knobs 24, which have recesses 25 for receiving Allen wrenches or ratchet drives, or the like, for giving extra mechanical advantage for turning the knobs 24, as desired.

Figure 4:
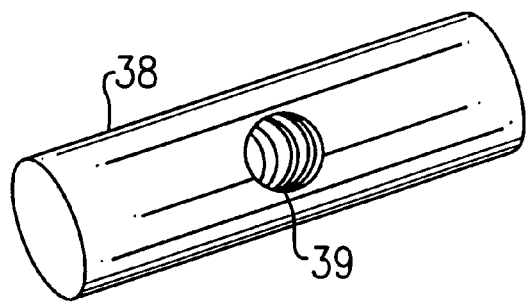
FIG. 4 is a perspective view of a traveling pin of the seating mechanism of FIGS. 3A and 3B.
Figure 3A:
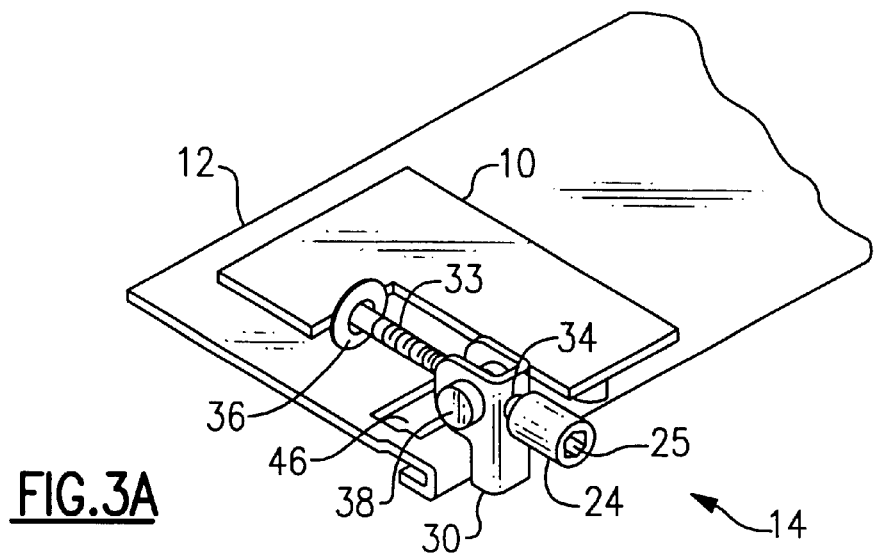
FIGS. 3A–3D shows the assembly of the seating mechanism for seating the FRU in the rack of FIG. 1.
Figure 3B:
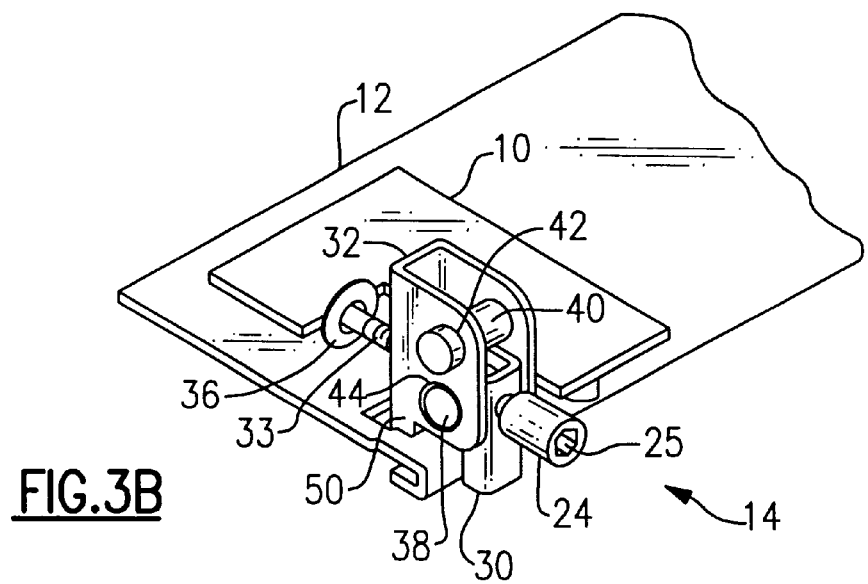

FIGS. 3A–3D show the assembly of the seating mechanism 14 which has a linear stop 30 and a rotating cam member 32, which in one preferred embodiment may be two pieces, or in a second preferred embodiment may be a single piece. The knob 24 is attached to a threaded shaft 33 which extends through a hole 35 in the linear stop 30 and terminates in a keeper 36. A traveling pin 38 is placed through wings of the linear stop and has a threaded hole 39 therethrough (see FIG. 4). It will be understood that when the knob 24 is turned, the threaded shaft 33 will turn in the threaded hole 39, causing the pin 38 to move, in turn causing the linear stop 30 to move along the length of the shaft 33. The rotating cam member 32 pivots around a pivot pin 40 through holes 42 in wings of the rotating cam member 32. The traveling pin 38 is positioned in slotted holes 44 in the wings of the rotating cam member 32. As shown in FIGS. 3A and 3B, the floor 13 of the rack 12 has a hole 46, and the rotating cam member 32 has a foot 50, which, when the traveling pin 38 is at one extreme end of the slot 44, pushes the edges of the hole 46 to either seat the FRU 10 or unseat the FRU 10, depending upon which way the knobs 24 are being turned.

Figure 3C:
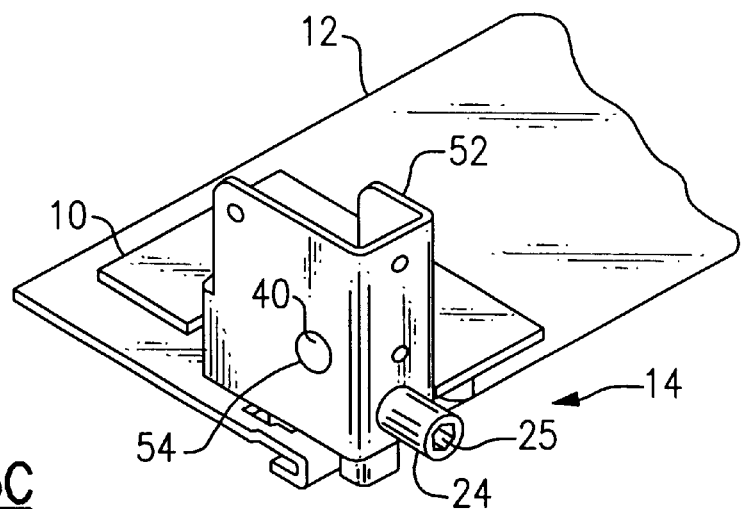
Figure 3D:
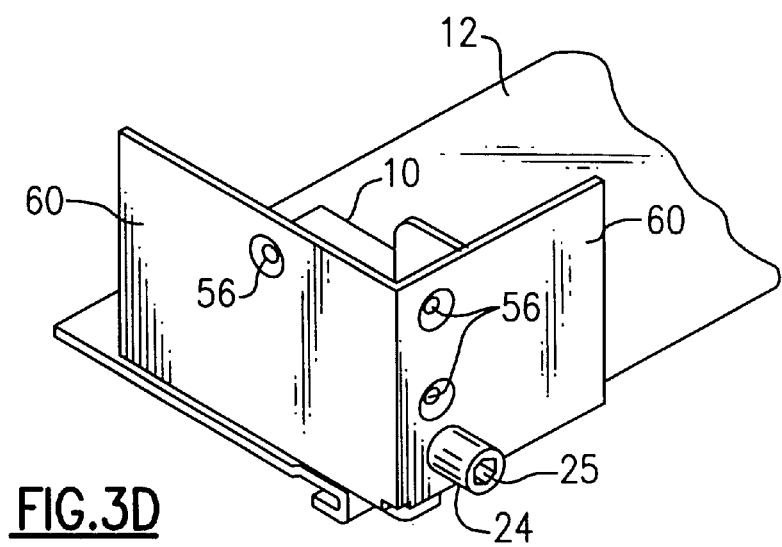

Turning to FIG. 3C, the seating mechanism includes a shroud member 52 which has wings surrounding the rotating cam member 32, which in turn covers the linear stop 30. The shroud member 52 has holes 54 for holding the pivot pin 40, and is held in place by fasteners such as screws 56 which are screwed through the sides 60 of the FRU 10, to hold the seating mechanism 14 in place. It will be understood that a pair of holes may be placed in the shroud member 52 such that the shroud member 52 may be turned over and used on the other end of the FRU 10 so that only one piece needs to be manufactured to provide a seating mechanism 14 on each side of the FRU 10, as shown in FIG. 2. It will also be understood that the keeper 36 is provided to keep the threaded shaft 33 from being completely extracted from the traveling pin 38.

Figure 5A:
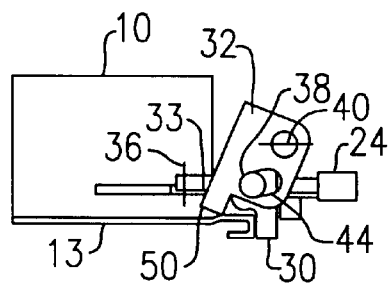
FIGS. 5A–5H shows the progression of the operation of the seating mechanism from the unseated position in FIG. 5A to the fully seated position of FIG. 5H.
Figure 5B:
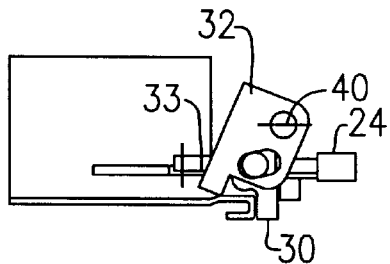
Figure 5C:
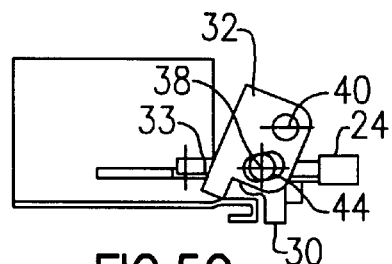
Figure 5D:
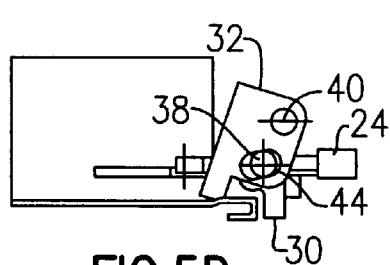
Figure 5E:
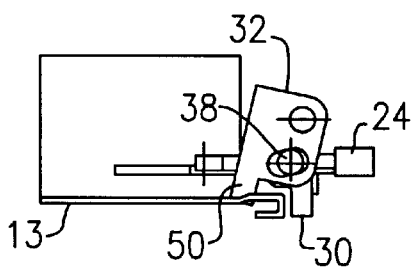
Figure 5F:
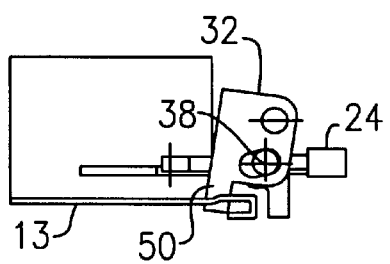
Figure 5G:
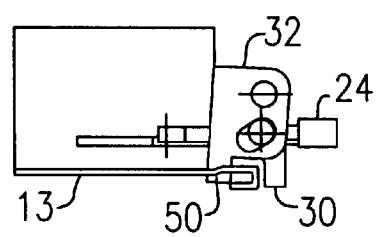
Figure 5H:
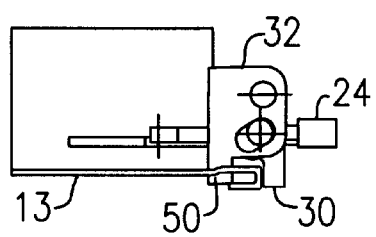

FIGS. 5A–5H show the progression of the operation of the seating mechanism 14 from the unseated position in FIG. 5A to the fully seated position of FIG. 5H. In the position of FIG. 5A, the threaded shaft 33 is fully screwed out so that the traveling pin 38 is at the inmost end of the slotted hole 44, and the rotating cam member 32 is rotated to its up position so that the foot 50 is fully up and withdrawn into the FRU 10. The linear stop 30 is also in its inmost position so that it acts to stop the FRU 10 as it is being pushed onto the floor 13 of the rack 12. This provides for a positive stop of the FRU 10 before the pins of the connector 20, 21 can make contact in an uncontrolled manner.

When the FRU 10 is fully pushed into the rack 12 such that the linear stop 30 stops further movement, the knobs 24 are turned, causing the traveling pin 38 to move outwardly in the slot 44. The slot 44 has an upward slope such that the movement of the traveling pin 38 causes the rotating cam member 32 to rotate about the pivot pin 40. This causes two motions, the linear stop 30 moves in a outwardly direction, and the foot 50 is rotated downwardly, as shown in FIGS. 5A–5F. When the traveling pin 38 reaches the end of the slot 44, the foot 50 is projecting down into the hole 46 in the floor 13 of the rack 12, and the linear stop 30 is in its outmost position. Further turning on the knob 24 causes the foot 50 to push against the edge of the hole 46, pushing the FRU 10 inward, pushing the connectors 20, 21 into engagement in a controlled manner. Finally, as shown in FIG. 5H, the FRU 10 is in its fully seated position with the end of the floor against the linear stop 30, and the connector half 20 fully inserted into the connector half 21.

To unseat the FRU 10, the seating mechanism 14 works in the opposite direction. Turning the knob 24 in the unseating direction causes the foot 50 to push against the opposite edge of the hole 46, unseating the connector 20, 21 and moving the FRU 10 in an outwardly direction. As the knob 24 is turned more, the rotating cam member 30 is pivoted around pivot pin 40, moving the foot 50 upwardly until it is fully in the FRU 10. At the same time, the linear stop 30 is moved from its fully outward position of FIG. 5F to its fully inward position of FIG. 5A. The FRU 10 can then be slidably removed from the rack 12 by the handle 18 (see FIG. 1).

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A mechanism for seating and unseating a module in a rack having a floor with slidable engagement with the module, the floor having a hole therein, the mechanism comprising:
   a linear stop for stopping the movement of the module into the rack;
   a camming foot for coacting with the hole in the floor of the rack for seating and unseating the module in the rack; and
   an adjustment device for moving the linear stop from an inmost position to an outmost position, and simultaneously lowering the camming foot into the hole in the floor and moving the camming foot to urge the module into a fully seated position wherein the module is moved against the linear stop when the linear stop is in its outmost position.

2. The mechanism of claim 1 wherein the adjustment device comprises a knob connected to a threaded shaft, said knob, when turned, turns the threaded shaft causing said linear stop to travel between its inmost position to its outmost position.

3. The mechanism of claim 2 wherein said linear stop is linked to said threaded shaft by a traveling pin having a threaded hole therethrough and arranged such that when said threaded shaft is turned it advances in the threaded hole in said traveling pin, causing the threaded pin to move the linear stop.

4. The mechanism of claim 3 wherein said camming foot comprises a rotating cam member linked to said traveling pin such that when the linear stop is in its inmost position the rotating cam member is rotated to an up position such that the camming foot is removed from the hole in the floor of the rack, and when the linear stop is in its outmost position, the rotating cam member is rotated to a down position such that the camming foot is in the hole in the floor of the rack, and wherein further turning of the threaded shaft in the traveling pin causes the camming foot to coact with the hole to push the module either to its seated position or its unseated position depending on the direction of turning of the threaded shaft.

5. The mechanism of claim 4 wherein said rotating cam member is linked to said traveling pin by the traveling pin riding in a slotted hole in said rotating cam member, said slotted hole slanting upwardly such that when the traveling pin is at the lower extreme of the slotted hole, the rotating cam member is in the up position, and when the traveling pin in at the upper extreme of the slotted hole, the rotating cam member is in the down position.

6. A method for seating and unseating a module in a rack having a floor with slidable engagement with the module, the floor having a hole therein, the method comprising:
   sliding said module into said rack;
   stopping the movement of the module into the rack by a linear stop; and
   moving the linear stop from an inmost position to an outmost position, and simultaneously lowering a camming foot into the hole in the floor and moving the camming foot to coact with the hole in the floor to urge the module into a fully seated position wherein the module is moved against the linear stop when the linear stop is in its outmost position.

7. The method of claim 6 wherein moving the linear stop comprises turning a knob at the end to a threaded shaft, said knob, when turned, turning the threaded shaft causing said linear stop to travel between its inmost position to its outmost position.

8. The method of claim 7 further comprising linking said linear stop to said threaded shaft by a traveling pin having a threaded hole therethrough, turning said threaded shaft such that it advances in the threaded hole in said traveling pin, causing the threaded pin to move the linear stop.

9. The method of claim 8 wherein said camming foot comprises a rotating cam member, and said method further comprises linking said traveling pin to said rotating cam member such that when the linear stop is in its inmost position the rotating cam member is rotated to an up position such that the camming foot is removed from the hole in the floor of the rack, and when the linear stop is in its outmost position, the rotating cam member is rotated to a down position such that the camming foot is in the hole in the floor of the rack, and wherein further turning of the threaded shaft in the traveling pin causes the camming foot to coact with the hole to push the module either to its seated position or its unseated position depending on the direction of turning of the threaded shaft.

10. The method of claim 9 further comprising linking said rotating cam member to said traveling pin by providing for the traveling pin to ride in a slotted hole in said rotating cam member, said slotted hole slanting upwardly such that when the traveling pin is at the lower extreme of the slotted hole, the rotating cam member is in the up position, and when the traveling pin in at the upper extreme of the slotted hole, the rotating cam member is in the down position.

* * * * *